United States Patent [19]
Yasumura et al.

[11] Patent Number: 6,033,952
[45] Date of Patent: Mar. 7, 2000

[54] METHOD OF MANUFACTURING A SEMICONDUCTOR DEVICE

[75] Inventors: Shunji Yasumura; Shinya Watanabe, both of Tokyo, Japan

[73] Assignee: Mitsubishi Denki Kabushiki Kaisha, Tokyo, Japan

[21] Appl. No.: 09/307,567

[22] Filed: May 10, 1999

[30] Foreign Application Priority Data

Nov. 30, 1998 [JP] Japan .................................. 10-340108

[51] Int. Cl.$^7$ .............................................. H01L 21/8242
[52] U.S. Cl. .......................... 438/253; 438/255; 438/396
[58] Field of Search ................................... 438/253, 254, 438/255, 396, 397, 398, 399

[56] References Cited

U.S. PATENT DOCUMENTS

| | | | |
|---|---|---|---|
| 5,272,103 | 12/1993 | Nakamura | 438/253 |
| 5,691,249 | 11/1997 | Watanabe et al. | 438/398 |
| 5,789,291 | 4/1998 | Sung | 438/254 |
| 5,883,006 | 3/1999 | Iba | 438/712 |

FOREIGN PATENT DOCUMENTS 58-122    1/1983    Japan .

*Primary Examiner*—Kevin M. Picardat
*Attorney, Agent, or Firm*—McDermott, Will & Emery

[57] ABSTRACT

A semiconductor device manufacturing method which involves a fewer number of manufacturing processes and which eliminates the use of expensive high precision stepper and half-tone mask, or the like, by employing a simplified process flow, in which method an identical mask is reused to ensure registration margin without involving a high-resolution process. A contact hole requires solely a minimum diameter of 0.30 μm or thereabouts, thereby resulting in and added margin for the minimum diameter and eliminating a process for reducing a hole diameter. Even if the hole diameter has a deviation of about 0.05 μm, contact can be established with a silicon substrate, thereby eliminating a necessity for an expensive, high precision stepper which has been required for ensuring a registration margin. A damaged layer, which would otherwise cause an increase in the resistance of the storage node direct contact, is eliminated simultaneously with etching of a thick polysilicon film, thus eliminating a chemical dry etching (CDE) process which has conventionally been used for removing a damaged layer.

13 Claims, 19 Drawing Sheets

100: STORAGE NODE 10, 12: TRANSFER GATE
14: OXIDE FILM
16: Si SUBSTRATE

20 : PHOTORESIST

30: DAMAGED LAYER

50: THICK POLYSILICON FILM

60: PHOTORESISIT

80:THIN ROUGHENED FILM

90:PHOTORESIST

100:STORAGE NODE

110:TEOS FILM

30:DAMAGED LAYER

140:THICK POLYSILICON FILM

150:FRAME
155:PHOTORESISIT

160:POLYSILICON FILM

170:THIN ROUGHENED FILM

180:PHOTORESIST

200:ETCH STOPPER FILM(SiN)

210:PHOTORESISIT FRAME
215:PHOTORESISIT

230:ROUGHENED FILM

240:PHOTORESISIT

F I G. 2 6
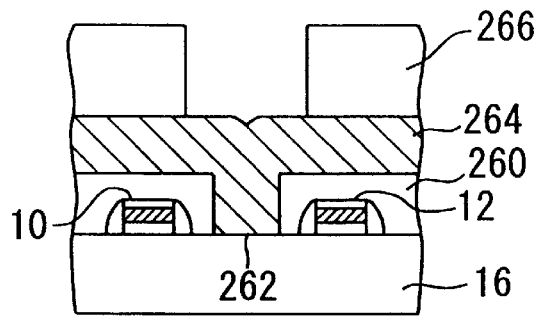
260: OXIDE FILM
262: BOTTOM OF STORAGE NODE CONTACT
264: NON-DOPED POLYSILICON FILM
266: POSITIVE PHOTORESISIT
F I G. 2 7
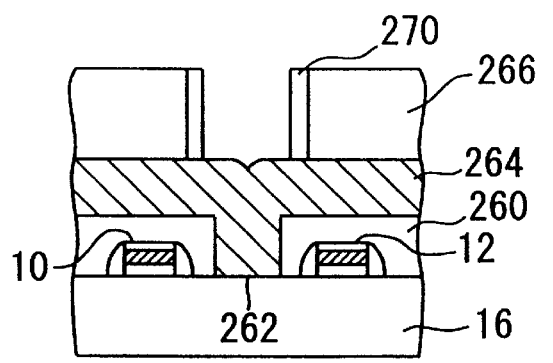
270: POSITIVE PHOTORESISIT FRAME
F I G. 2 8
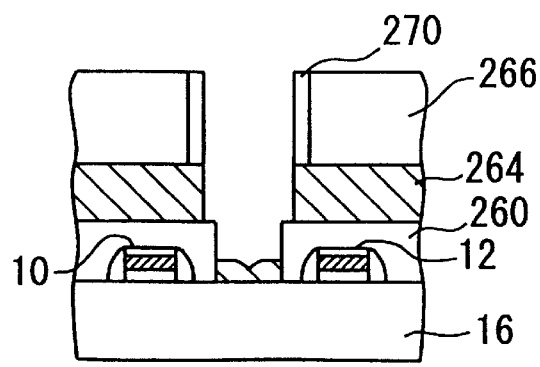

290: SURFACE-ROUGHENED FILM
292: THIN POLYSILICON FILM

300: NEGATIVE PHOTORESIST
302: PHOTORESIST FRAME

320:ETCH STOPPER FILM(SILICON NITRIDE)
322:POSITIVE PHOTORESIST

350: THIN POLYSILICON FILM
352: ROUGHENED POLYSILICON FILM
354: NEGATIVE PHOTORESIST

FIG. 43A
FIG. 43B
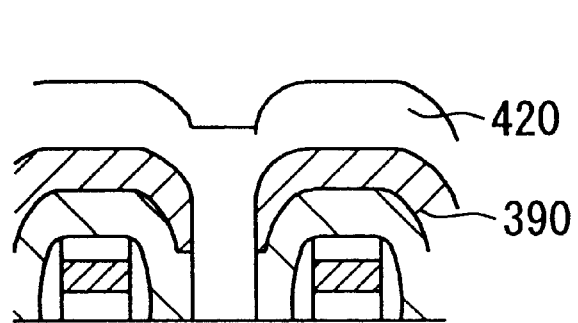
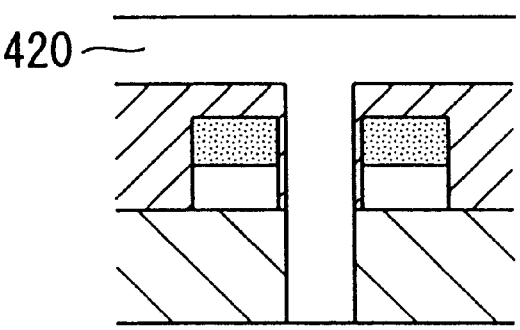
FIG. 44A
FIG. 44B
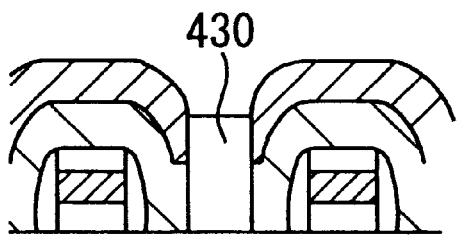
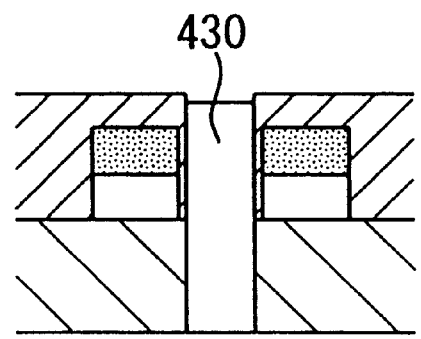

METHOD OF MANUFACTURING A SEMICONDUCTOR DEVICE

BACKGROUND OF THE INVENTION

1. Field of the Invention

The present invention relates to a method of manufacturing a semiconductor device, and more particularly, to a semiconductor device manufacturing method employing a simplified process for forming a cylindrical capacitor of DRAM.

2. Description of Related Art

In association with recent progress toward miniaturizing of DRAM (Dynamic Random Access Memory), particularly 64-megabit DRAM, the capacitance of a capacitor becomes more difficult to ensure. However, the next generation of DRAM is considered to require a further increase in the capacitance of a capacitor. A method of manufacturing conventional 64 Mb DRAM, particularly a method of forming cylindrical capacitors of DRAM, employs a thick film surface roughening method, wherein even a step for forming a cylindrical capacitor involves a large number of processes. Therefore, the step assumes a complicated process flow.

FIG. 38 is a top view showing the structure of a storage node of a conventional cylindrical capacitor. FIGS. 39A through 50B are cross-sectional views arranged in sequential order of some of steps for forming a storage node of the conventional cylindrical capacitor. Throughout FIGS. 38 to 50B, identical reference numerals designate identical elements, and repetition of their explanations is omitted.

In FIG. 38, reference numeral 383 designates a transfer gate formed on a silicon substrate (not shown); 382 designates a transfer gate frame such as a TG383; 395 designates a polysilicon bit line; BC denotes a bit line contact; and SC denotes an storage node contact. Each of FIGS. 39 to 50 comprises drawings A and B. Drawings A are cross-sectional views taken along line A1–A2 shown in FIG. 38 (hereinafter referred to as "horizontal cross-sectional views"), and drawings B are cross-sectional views taken along line B1–B2 shown in FIG. 38 (hereinafter referred to as "vertical cross-sectional views").

FIGS. 39A and 39B show an oxide film 380 which is formed (between the transfer gate and the polysilicon bit line) over a wafer having TGs 383 and 384 formed thereon. FIG. 40A shows an oxide film 390 which is formed (at a position between the polysilicon bit line and the storage node) over the oxide film 380. As shown in FIG. 40B, each of the polysilicon bit lines 395 and 397 is of two-tier structure comprising WSi and a polysilicon film. As shown in FIGS. 41A and 41B, an etch pattern which enables a storage node to be formed so as to make direct contact with the substrate (such a storage node will hereinafter be referred to simply as a "storage node direct contact") is formed on the oxide film 390 by use of a photoresist 400.

As shown in FIGS. 42A and 42B, the oxide films 380 and 390 are subjected to dry etching along the etch pattern. In this case, the storage node direct contact is required to assume a diameter 412 of about 0.1 $\mu$m and a depth 414 of about 1 $\mu$m. As a result of a CF-based gas being used for dry-etching the oxide films 380 and 390, implanted C ions are considered to form a transformed SiC layer by union with the silicon substrate. The thus-transformed layer is called a damaged layer 410 and causes an increase in the resistance of the storage node direct contact. For this reason, the damaged layer 410 is eliminated through a chemical dry etching process performed through use of a down-flow etcher. As mentioned above, the storage node direct contact is required to assume a diameter 412 of about 0.1 $\mu$m and a depth 414 of about 1 $\mu$m. Further, there is needed an additional process for removing the damaged layer 410 through chemical dry etching (CDE).

As shown in FIGS. 43A and 43B, a polysilicon film 420 is formed on the oxide film 390 after removal of the photoresist 400. Subsequently, as shown in FIGS. 44A and 44B, the polysilicon film 420 is etched back to thereby form a polysilicon plug 430. Further, as shown in FIGS. 45A and 45B, a polysilicon film (for use in forming a storage node) 440 is formed over the polysilicon plug 430 and the oxide film 390. As shown in FIGS. 46A and 46B, an etch pattern is formed on the polysilicon film (for use in forming a storage node) 440 through use of a photoresist film 450. Then, as shown in FIGS. 47A and 47B, the polysilicon film 440 is etched to the oxide film 390.

As shown in FIGS. 48A and 48B, a frame 472 which will serve as the internal surface of a cylindrical storage node is formed on the surface of the oxide film 440 through a framing process (hereinafter referred to as a "RELACS process" or "RELACS processing"). An etch pattern is formed on the frame 472 through use of a negative photoresist 470. FIGS. 49A and 49B show the wafer after etching. As shown in FIGS. 50A and 50B, a cylindrical storage node is formed.

As set forth, the conventional method for manufacturing 64 Mb DRAM requires minute holes, and an expensive, high precision stepper and half-tone mask, etc., are required for ensuring registration margin corresponding to such a minute hole. To ensure a registration margin, there is also required a process for reducing a hole diameter. As a result, the diameter of a contact becomes smaller, which in turn increases contact resistance. Further, there are required an additional process for removing a damaged layer and a process for smoothing a high step through use of BPTEOS (BP-tetraethoxysilane), thereby resulting in an increase in the number of manufacturing processes.

SUMMARY OF THE INVENTION

The present invention has been conceived to solve the foregoing problem, and the object of the present invention is to provide a semiconductor device manufacturing method which involves fewer manufacturing processes and which eliminates use of an expensive, high precision stepper and half-tone mask, or the like, by employing a simplified process flow, in which method an identical mask is reused to ensure registration margin without involving a high-resolution process.

According to a first aspect of the present invention, there is provided a method of manufacturing a semiconductor device comprising the steps of forming on a silicon substrate a plurality of transfer gates, each of which has a frame; forming an oxide film for use as an interlayer dielectric film so as to extend over the plurality of transfer gates and holes formed between the plurality of transfer gates; a first etch pattern forming on the oxide film an etch pattern which can establish contact with the silicon substrate so as to extend across the frames, through a storage node mask and by use of a positive photoresist; a first dry-etching the oxide film along the etch pattern by setting an etch time to a time required for etching away the oxide film deposited at the bottom of the hole; forming a thick polysilicon film on the oxide film; a second etch pattern forming the etch pattern on the thick polysilicon film, through the previously-used storage node mask once again and by use of a positive photoresist; a second dry-etching in a collective manner the thick polysilicon film and a damaged layer that is formed on the silicon substrate as a result of the first dry etch step, by setting an etch time to a time required for etching away the thick polysilicon film and the damaged layer; a third etch pattern forming an etch pattern on the thick polysilicon film, through the storage node mask and by use of a negative photoresist; and a third dry etch forming a storage node by dry-etching the thick polysilicon film along the etch pattern that is formed as a result of the third etch pattern forming step, by means of anisotropic etching.

According to a second aspect of the present invention, there is provided a method of forming a semiconductor device comprising the steps of: forming on a silicon substrate a plurality of transfer gates, each of which has a frame; forming an oxide film for use as an interlayer dielectric film so as to extend over the plurality of transfer gates and holes formed between the plurality of transfer gates; a first etch pattern forming on the oxide film an etch pattern which can establish contact with the silicon substrate so as to extend across the frames, through a storage node mask and by use of a positive photoresist; a first dry-etching the oxide film along the etch pattern by setting an etch time to a time required for etching away the oxide film deposited at the bottom of the hole; a damaged layer removal step of removing a damaged layer formed on the silicon substrate as a result of the first dry etching step, by means of dry chemical etching; forming a thick polysilicon film on the oxide film; a second etch pattern forming on the thick polysilicon film, through the previously-used storage node mask and by use of a positive photoresist; a step of forming a frame along the surface of the positive photoresist formed during the second etch pattern forming step; a second dry-etching in a collective manner the thick polysilicon film and a damaged layer that is formed on the silicon substrate as a result of the first dry etch step, by setting an etch time to a time required for etching away the thick polysilicon film such that a portion of the thick polysilicon film is left at the bottom of the hole; a third etch pattern forming an etch pattern on the thick polysilicon film, through the storage node mask and by use of a negative photoresist; forming a frame along the surface of the negative photoresist formed during the step of the third etch pattern forming; and a third dry etch forming a storage node by dry-etching the thick polysilicon film along the etch pattern, in which a frame is formed during the frame forming step, by means of anisotropic etching.

According to a third aspect of the present invention, there is provided a method of forming a semiconductor device comprising the steps of: forming on a silicon substrate a plurality of transfer gates, each of which has a frame; forming an oxide film for use as an interlayer dielectric film so as to extend over the plurality of transfer gates; forming a non-doped polysilicon film on the oxide film; a first etch pattern forming on the oxide film an etch pattern which can establish contact with the silicon substrate so as to extend across the frames, through a storage node mask and by use of a positive photoresist; forming a frame along the surface of the positive photoresist formed in the first etch pattern forming step; a first dry-etching the non-doped polysilicon film along the etch pattern, in which a frame is formed, by setting an etch time to a time required for etching away the non-doped polysilicon film such that a portion of the non-doped polysilicon film is left at the bottom of each of the holes formed among the plurality of transfer gates; forming a thin polysilicon film on the non-doped polysilicon film, the oxide film, and the non-doped polysilicon film remaining at the bottom of the hole; a second etch pattern forming the etch pattern on the thin polysilicon film, through the storage node mask and by use of a negative photoresist; forming a frame along the surface of the negative photoresist formed during the step of the second etch pattern forming; and a second dry etch forming a storage node by dry-etching the thin polysilicon film along the etch pattern, in which a frame is formed during the frame forming step, by means of anisotropic etching.

The above and other objects, effects, features and advantages of the present invention will become more apparent from the following description of the embodiments thereof taken in conjunction with the accompanying drawings.

BRIEF DESCRIPTION OF THE DRAWINGS

FIG. 1 shows transfer gates (TG) 10 and 12 that are formed on a silicon substrate 16.

FIG. 2 shows an etch pattern which enables a storage node direct contact to be formed to a minimum diameter of 0.30 $\mu$m or thereabouts is patterned on the oxide film 14 through a mask, by use of photolithography using a photoresist 20.

FIG. 3 shows that the oxide film 14 is selectively etched along the etch pattern by means of dry etching.

FIG. 5 shows that a thick polysilicon film 50 is formed to a thickness of 8000 angstroms on the oxide film 14 after opening of the storage node direct contact.

FIG. 6 shows that the mask which has been used in preparing the etch pattern for the storage node direct contact is reused to thereby form a photoresist 60 on the thick polysilicon film 50.

FIG. 7 shows that the polysilicon film 50 is etched away along the etch pattern through anisotropic etching.

FIG. 8 shows that the thick polysilicon film 50 is roughened to a roughness of about 2.0 (1.5 to 2.5) through use of a single wafer low pressure CVD system.

FIG. 9 shows that an etch pattern is formed on the roughened film 80 through use of a storage node mask and a photoresist 90.

FIG. 10 shows that the thick polysilicon film 50 is dry-etched along the etch pattern through anisotropic etching.

FIG. 11 shows that the transfer gates 10 and 12 are formed on the silicon substrate 16 according to a method identical with the conventional method.

FIG. 12 shows that an etch pattern which enables formation of a storage node direct contact to a minimum diameter of 0.20 $\mu$m or thereabouts is formed on the oxide film 110 through a mask, by means of photolithography employing the photoresist 20.

FIG. 13 shows that the oxide film 110 is selectively etched along the etch pattern, by means of dry etching.

FIG. 14 shows that a thick polysilicon film 140 is formed to a thickness of 8000 angstroms on the oxide film 110 after opening of the storage node direct contact.

FIG. 15 shows that the mask that has been used in preparing the etch pattern for the storage node direct contact is reused to thereby form a positive photoresist 155 on the thick polysilicon film 140.

FIG. 16 shows that the polysilicon film 140 is etched away along the etch pattern through anisotropic etching.

FIG. 17 shows that the thick polysilicon film 140 is roughened to a roughness of about 2.0 (1.5 to 2.5) through use of a single wafer low pressure CVD system (not shown).

FIG. 18 shows that an etch pattern is formed on the roughened film 170 through use of the previously-used storage node mask and a negative photoresist 180 which is opposite in polarity to the photoresist 155.

FIG. 19 shows that the thick polysilicon film 140 is dry-etched along the etch pattern through anisotropic etching.

FIG. 20 shows that a SiN film 200 is formed as an etch stopper film on the TEOS film 110 after formation of a storage node direct contact.

FIG. 21 shows that an etch pattern for use in forming a storage node is formed on the thick polysilicon film 140 by use of a positive photoresist 215.

FIG. 22 shows that the thick polysilicon film 140 is etched along the framed etch pattern through anisotropic etching.

FIG. 23 shows that the thick polysilicon film 140 is roughened to a roughness of about 2.0.

FIG. 24 shows that an etch pattern is formed on the roughened film 230 by use of the previously-used storage node mask and a negative photoresist 240 which is opposite in polarity to the previously-used photoresist.

FIG. 25 shows through anisotropic etching the thick polysilicon film 140 is dry-etched along the etch pattern.

FIGS. 26 through 31 are cross-sectional views arranged in sequential order of steps of a process for manufacturing a cylindrical capacitor according to a embodiment 4.

FIG. 26 shows that the transfer gates 10 and 12 are prepared on the silicon substrate 16 according to a method identical with the conventional manufacturing method.

FIG. 27 shows that the positive photoresist 266 is subjected to RELACS processing, thereby forming a positive photoresist frame 270.

FIG. 28 shows that the non-doped polysilicon film 264 is etched through anisotropic dry etching so as to leave a non-doped polysilicon film 280 at the bottom of the contact hole, thereby forming the internal diameter of the cylindrical storage node.

FIG. 29 shows that a thin polysilicon film 292 is deposited to a thickness of 100 nm on the non-doped polysilicon film 264, the oxide film 260, and the non-doped polysilicon film 280 left at the bottom of the contact hole.

FIG. 30 shows that the wafer is subjected to photolithography by use of the previously-used mask (FIG. 26) and a negative photoresist 300.

FIG. 31 shows that after formation of the negative photoresist 300; the non-doped polysilicon film 264, the thin polysilicon film 292, and the roughened film 290 are removed through dry etching until the oxide film 260 becomes uncovered.

FIG. 32 shows that the transfer gates 10 and 12 are formed on the silicon substrate 16 according to a method identical with the conventional manufacturing method.

FIG. 33 shows that the positive photoresist 322 is subjected to RELACS processing, thereby forming a positive photoresist frame 330.

FIG. 34 shows that the non-doped polysilicon film 264 is selectively etched through anisotropic dry etching so as to leave a non-doped polysilicon film 280 until the etch stopper nitride film 320 becomes uncovered, thereby forming the internal diameter of the cylindrical storage node.

FIG. 35 shows that a thin polysilicon film 350 is deposited to a thickness of 100 nm on the non-doped polysilicon film 264.

FIG. 36 shows that through the previously-used mask (FIG. 32), the wafer is subjected to photolithography employing a negative photoresist 354.

FIG. 37 shows that the non-doped polysilicon film 264, the thin polysilicon film 350, and the roughened film 352 are removed through dry etching until the oxide film 260 becomes uncovered after formation of the negative photoresist 354.

FIGS. 39A through 50B are cross-sectional views arranged in sequential order of some of steps for forming a storage node of the conventional cylindrical capacitor.

FIGS. 39A and 39B show an oxide film 380 which is formed (between the transfer gate and the polysilicon bit line) over a wafer having TGs 383 and 384 formed thereon.

FIGS. 43A and 43B show that a polysilicon film 420 is formed on the oxide film 390 after removal of the photoresist 400.

FIGS. 44A and 44B show that the polysilicon film 420 is etched back to thereby form a polysilicon plug 430.

FIGS. 50A and 50B show a cylindrical storage node is formed.

DETAILED DESCRIPTION OF THE PREFERRED EMBODIMENTS

Figure 1:
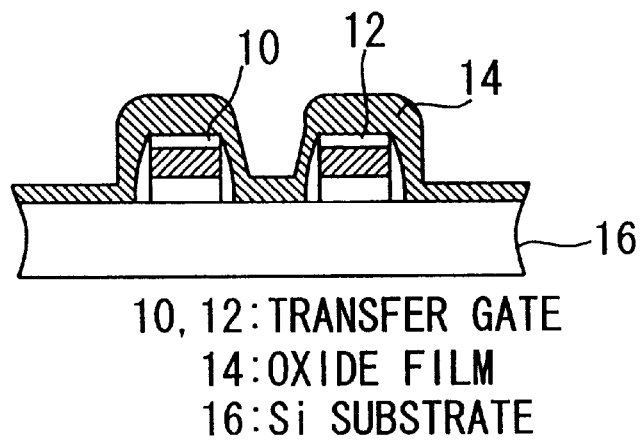
FIGS. 1 through 3 and 5 through 10 are cross-sectional views arranged in sequential order of steps of a process for manufacturing a cylindrical capacitor according to a embodiment 1 of the present invention.

Embodiments of the present invention will be described below with reference to the accompanying drawings. It is noted that the same reference symbols in the drawings denote the same or corresponding components.

Embodiment 1

FIGS. 1 through 3 and 5 through 10 are cross-sectional views arranged in sequential order of steps of a process for manufacturing a cylindrical capacitor (storage node) according to a embodiment 1 of the present invention. FIG. 4 shows an opening of a photoresist which enables formation of a storage node direct contact. Throughout FIGS. 1 through 10, like reference numerals designate like elements, and repetition of their explanations is omitted.

As shown in FIG. 1, transfer gates (TG) 10 and 12 are formed on a silicon substrate 16 according to a conventional method. An oxide film 14 for use as an interlayer dielectric film is formed over the transfer gates 10 and 12. The oxide film 14 has recently tended to be formed from a single wafer BPTEOS film for use in smoothing during heat sintering. However, according to the embodiment 1, a TEOS (tetraethoxysilane) film to be used in a conventional diffusion furnace is formed as the oxide film.

Figure 2:
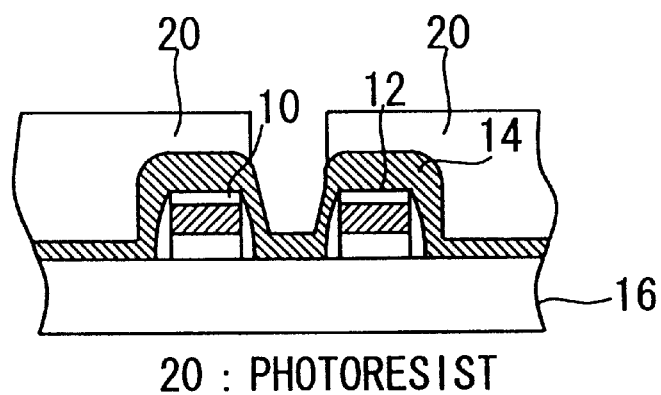

As shown in FIG. 2, an etch pattern which enables a storage node direct contact to be formed to a minimum diameter of 0.30 $\mu$m or thereabouts is patterned on the oxide film 14 through a mask, by use of photolithography using a photoresist 20. A transfer gate frame 40 is spaced away from a position 42 by only a distance substantially equal to the thickness of the oxide film 14. FIG. 4 is a plan view showing the relationship between the etch pattern and the transfer gate patterns 10 and 12 of a lower structure. As shown in FIG. 4, the etch pattern that can be formed according to the embodiment 1 ensures a range 44—in which direct contact can be established with the silicon substrate 16—such that the range extends from the transfer gate frame 40 of the transfer gate 10 to the transfer gate frame 40 of the transfer gate 12.

Figure 3:
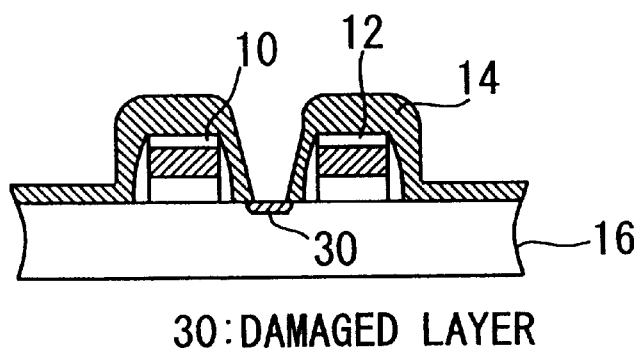
Figure 4:
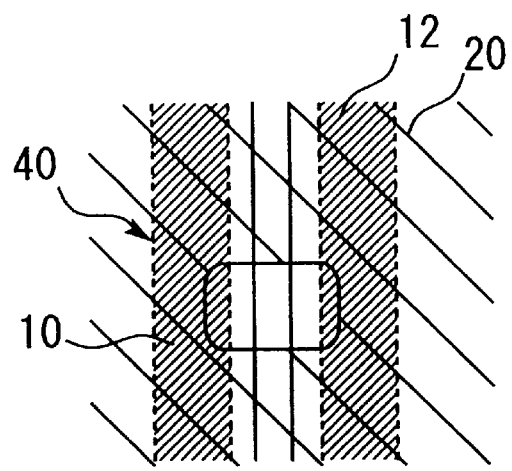
FIG. 4 shows an opening of a photoresist which enables formation of a storage node direct contact.

As shown in FIG. 3, the oxide film 14 is selectively etched along the etch pattern by means of dry etching. At this time, an etch time is set to a time required for etching away the oxide film 14 at the bottom of the hole. Even in the event of the hole having a displacement of about 0.05 $\mu$m, contact with the silicon substrate 16 can be established, and sufficient insulation can be ensured on the transfer gates 10 and 12. Such etching will be hereinafter referred to as semi self-aligned contact dry etching. As a result of a CF-based gas being used for dry-etching the oxide film 14 at the time of removal of the photoresist 20, implanted C ions are considered to form a transformed SiC layer by union with the silicon substrate 16. The transformed layer is called a damaged layer 30 and is formed to a depth of about 100 angstroms. Since the damaged layer 30 causes an increase in the resistance of the storage node direct contact, the damaged layer 30 must be removed. However, according to the embodiment 1, the damaged layer 30 is not removed immediately, and the processing proceeds to the next process.

Figure 5:
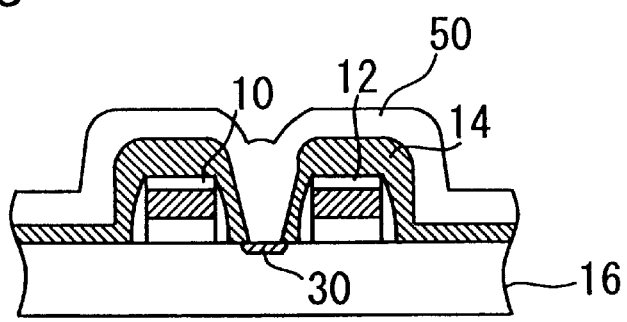
Figure 6:
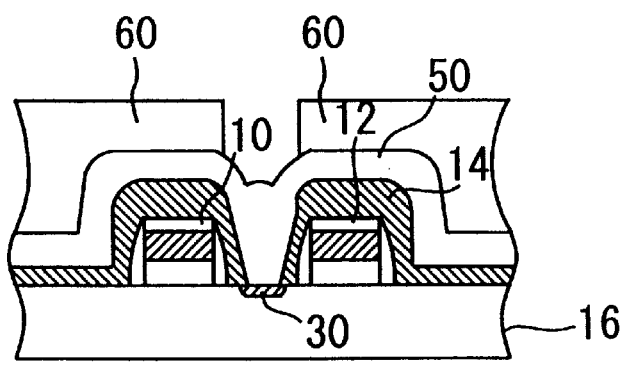

As shown in FIG. 5, after opening of the storage node direct contact, a thick polysilicon film 50 is formed to a thickness of 8000 angstroms on the oxide film 14. Subsequently, as shown in FIG. 6, the mask that has been used in preparing the etch pattern for the storage node direct contact is reused to thereby form a photoresist 60 on the thick polysilicon film 50. Since the etch pattern for use in forming a storage node direct contact is formed on the same pattern, registration of the etch pattern can be correctly ensured. Further, since the side walls of the transfer gates 10 and 12 are insulated from each other by presence of the oxide film, a sufficient registration margin is considered to be ensured even if the hole has a displacement of about 0.1 $\mu$m.

Figure 7:
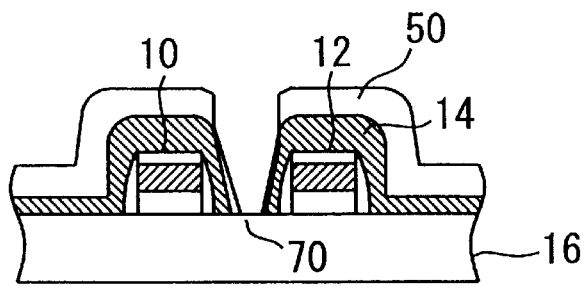

As shown in FIG. 7, the polysilicon film 50 is etched away along the etch pattern through anisotropic etching. At this time, so long as the etch time is set so that the thick polysilicon film 50 and the damaged layer 30 of the silicon substrate 16 are etched away, the damaged layer 30 can be eliminated through a single polysilicon dry etching process. Reference numeral 70 designates elimination of the damaged layer 30. Even if the silicon substrate 16 is etched to a thickness of about 100 $\mu$m during the dry etching, there is no problem in terms of device performance, so that a sufficient etch margin is ensured.

Figure 8:
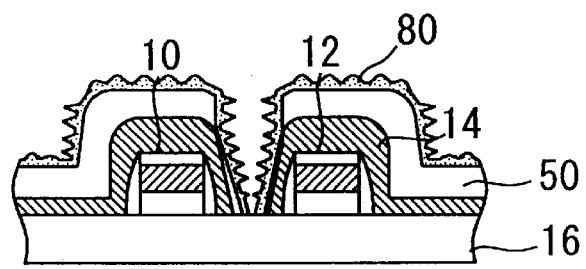

As shown in FIG. 8, the thick polysilicon film 50 is roughened to a roughness of about 2.0 (1.5 to 2.5) through use of a single wafer low pressure CVD system (not shown). The thick polysilicon film 50 that has been roughened is designated a thin roughened film (polysilicon film) 80 in FIG. 8. The roughness signifies a ratio of capacitance of the storage node when the polysilicon film is roughened to capacitance of the storage node when the polysilicon film is not roughened.

Figure 9:
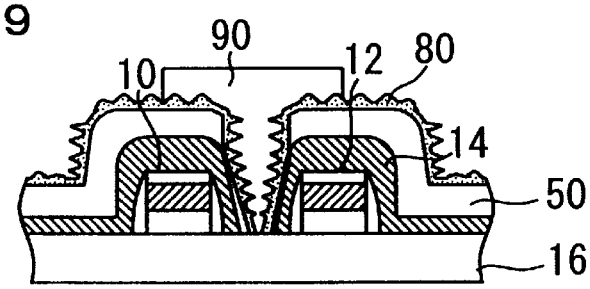
Figure 10:
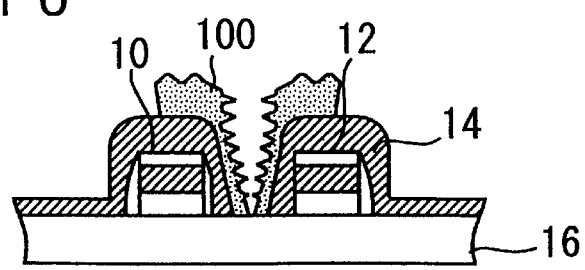

As shown in FIG. 9, an etch pattern is formed on the roughened film 80 through use of a storage node mask and a photoresist 90. Next, as shown in FIG. 10, the thick polysilicon film 50 is dry-etched along the etch pattern through anisotropic etching. The photoresist 90 is then removed, thereby forming a cylindrical capacitor (storage node) 100.

As mentioned above, according to the embodiment 1, the contact hole requires a minimum diameter of about 0.3 $\mu$m. Compared with the conventional hole diameter 412 that assumes a minimum value of 0.1 $\mu$m, the hole diameter formed in the embodiment 1 provides an added margin for the minimal diameter. Therefore, there is no necessity for a process for reducing the hole diameter. According to the embodiment 1, even if the hole diameter has a deviation of about 0.05 $\mu$m, contact can be established with the silicon substrate. Accordingly, an expensive, high precision stepper, which has been required for ensuring a registration margin, becomes unnecessary. According to the embodiment 1, the damaged layer 30, which would otherwise cause an increase in the resistance of the storage node direct contact, is removed simultaneously with etching of the thick polysilicon film 50, thereby eliminating a need for the CDE process that has been employed for removing the damaged layer 30.

Although according to the embodiment 1 a TEOS film is formed as the oxide film 110 through use of a conventional diffusion furnace, the simplified manufacturing flow described in connection with the embodiment 1 can be carried out even when a single wafer BPTEOS film—which has recently tended to be formed as an oxide film and is to be used for smoothing during heat sintering—may be formed as the oxide film 110.

Further, even when the roughening process shown in FIGS. 8 through 10 is not performed, the simplified manufacturing flow that has been described in connection with the embodiment 1 may be carried out.

Embodiment 2

FIGS. 11 through 19 are cross-sectional views arranged in sequential order of steps of a process for manufacturing a cylindrical capacitor according to a embodiment 2. Throughout FIGS. 11 through 19, like reference numerals designate like elements, and repetition of their explanations is omitted.

Figure 11:
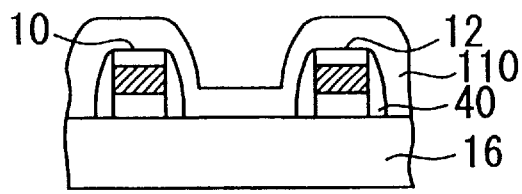
FIGS. 11 through 19 are cross-sectional views arranged in sequential order of steps of a process for manufacturing a cylindrical capacitor according to a embodiment 2.

As shown in FIG. 11, the transfer gates 10 and 12 are formed on the silicon substrate 16 according to a method identical with the conventional method. An oxide film 110 for use as an interlayer dielectric film is formed over the transfer gates 10 and 12. The oxide film 110 has recently tended to be formed from a single wafer BPTEOS film for use in smoothing during heat sintering. However, according to the embodiment 2, a TEOS (tetraethoxysilane) film to be used in a conventional diffusion furnace is formed as the oxide film.

Figure 12:
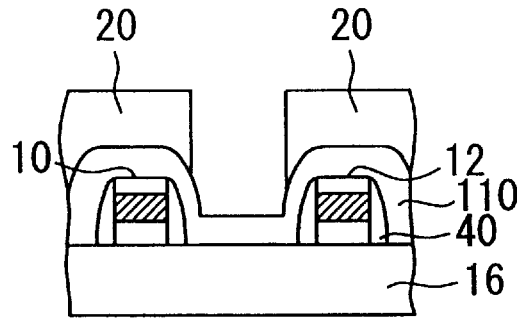
Figure 13:
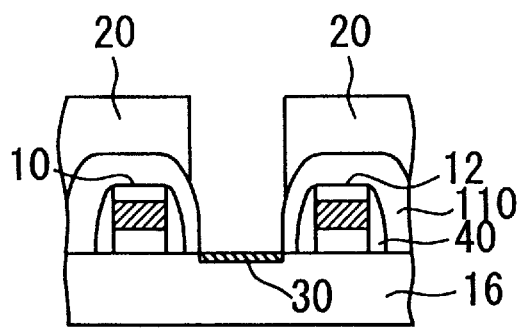

As shown in FIG. 12, an etch pattern which enables formation of a storage node direct contact to a minimum diameter of 0.20 $\mu$m or thereabouts is formed on the oxide film 110 through a mask, by means of photolithography employing the photoresist 20. As shown in FIG. 13, the oxide film 110 is selectively etched along the etch pattern, by means of dry etching. At this time, an etch time is set to a time required for etching away the oxide film 110 at the bottom of the hole. Even in the event of the hole having a displacement of about 0.05 $\mu$m, contact with the silicon substrate 16 can be established, and sufficient insulation can be ensured on the transfer gates 10 and 12. As a result of a CF-based gas being used for dry-etching the oxide film 110 at the time of removal of the photoresist 20, implanted C ions are considered to form a transformed SiC layer by union with the silicon substrate 16. The transformed layer is called a damaged layer 30 and is formed to a depth of about 100 angstroms. Since the damaged layer 30 causes an increase in the resistance of the storage node direct contact, the damaged layer 30 is removed through a chemical dry etching (CDE) process employing a conventional down flow etcher.

Figure 14:
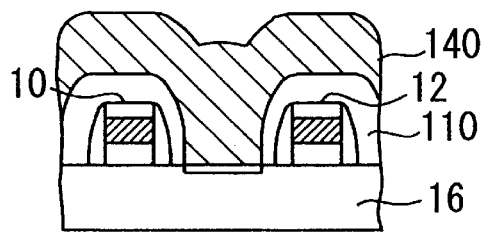
Figure 15:
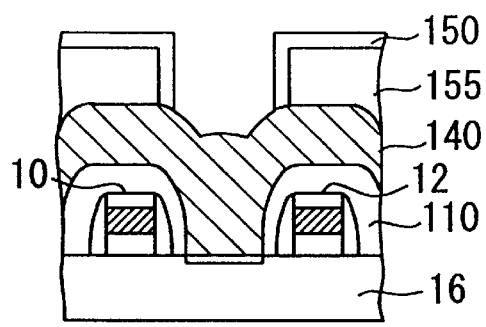

As shown in FIG. 14, after opening of the storage node direct contact, a thick polysilicon film 140 is formed to a thickness of 8000 angstroms on the oxide film 110. Subsequently, as shown in FIG. 15, the mask that has been used in preparing the etch pattern for the storage node direct contact is reused to thereby form a positive photoresist 155 on the thick polysilicon film 140. Since the etch pattern for use in forming a storage node direct contact is formed on the same pattern, correct registration of the etch pattern can be ensured. Further, since the side walls of the transfer gates 10 and 12 are insulated from each other by presence of the oxide film, a sufficient registration margin is considered to be ensured even if the hole has a displacement of about 0.1 $\mu$m. After photolithography, the positive photoresist 155 is subjected to RELACS processing. During RELACS processing, framing is carried out through use of organic material which selectively adheres to only the surface of the photoresist 155. The frame 150 of the photoresist 155 desirably assumes a thickness of about 500 angstroms, and may assume a thickness of about 250 to 1500 angstroms.

Figure 16:
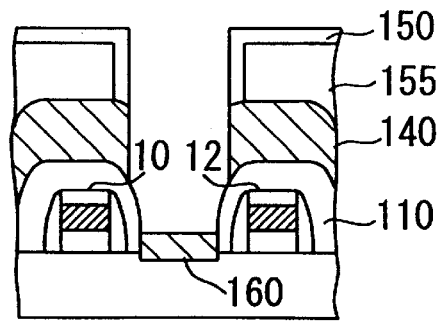

As shown in FIG. 16, the polysilicon film 140 is etched away along the etch pattern through anisotropic etching. At this time, so long as the etch time is set such that not all the thick polysilicon film 140 is etched away, the internal cylindrical portion of a cylindrical capacitor (storage node) is formed while the polysilicon film is left to only a thickness 160 (hereinafter referred to as a "polysilicon film 160").

Figure 17:
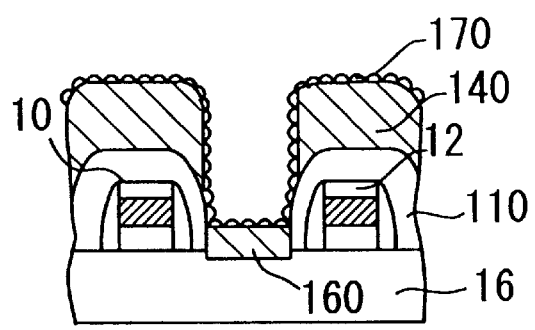
Figure 18:
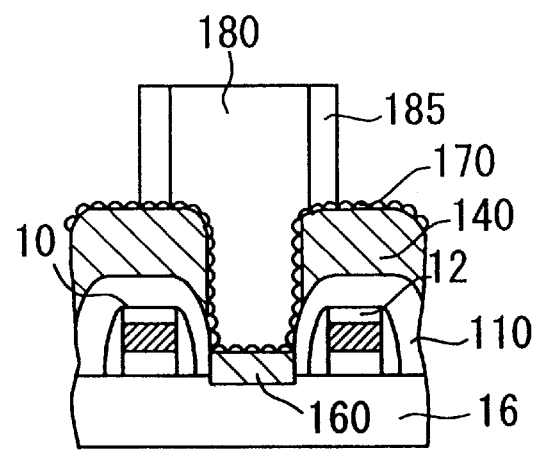

As shown in FIG. 17, the thick polysilicon film 140 is roughened to a roughness of about 2.0 (1.5 to 2.5) through use of a single wafer low pressure CVD system (not shown). The thick polysilicon film 140 that has been roughened is designated a thin roughened film (polysilicon film) 170 in FIG. 17. As shown in FIG. 18, an etch pattern is formed on the roughened film 170 through use of the previously-used storage node mask and a negative photoresist 180 which is opposite in polarity to the photoresist 155. Even in this case, after photolithography, the photoresist 180 is subjected to RELACS processing such that a processed portion may be formed in the photoresist 180, desirably to a thickness of about 500 angstroms. The portion of the photoresist 180 that has undergone RELACS processing, i.e., a portion 185, may assume a thickness of about 250 to 1500 angstroms. As a result of RELACS processing, a thickness of about 500 angstroms may be ensured as a registration margin for photolithography.

Figure 19:
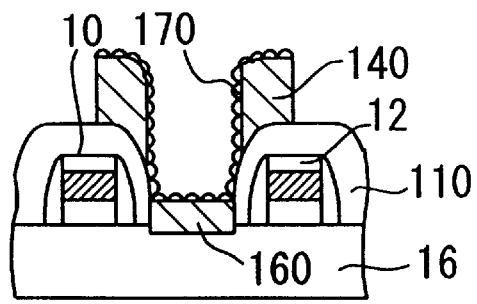

As shown in FIG. 19, the thick polysilicon film 140 is dry-etched along the etch pattern through anisotropic etching. The photoresist 180 is then removed, thereby forming the outer cylindrical portion of the cylindrical capacitor (storage node).

As mentioned above, according to the embodiment 2, the contact hole requires only a minimum diameter of about 0.20 $\mu$m. Compared with the conventional hole diameter 412 that assumes a minimum value of 0.1 $\mu$m, the hole diameter formed in the embodiment 2 provides an added margin for the minimal diameter. Therefore, there is no necessity for a process for reducing the hole diameter. According to the embodiment 2, even if the hole diameter has a deviation of about 0.05 $\mu$m, contact can be established with the silicon substrate. Accordingly, an expensive high precision stepper, which has been required for ensuring a registration margin, becomes unnecessary.

According to the embodiment 2, RELACS processing is employed for the photolithography during which is formed an etch pattern for use in forming a storage node. Aside from this processing, a result similar to that yielded by RELACS processing may be obtained by baking the photoresist 155 or 180 at a high temperature (e.g., 200° C.) after formation of the storage node etch pattern so as to effect bulging (hereinafter referred to as a "thermal bulging process").

Although according to the embodiment 2 a TEOS film is formed as the oxide film 110 through use of a conventional diffusion furnace, the simplified manufacturing flow described in connection with the embodiment 2 can be carried out even when a single wafer BPTEOS film—which has recently tended to be formed as an oxide film and is to be used for smoothing during heat sintering—may be formed as the oxide film 110.

Further, even when the roughening process shown in FIGS. 17 through 19 is not performed, the simplified manufacturing flow that has been described in connection with the embodiment 2 may be carried out.

Embodiment 3

A embodiment 3 is identical with the embodiment 2 with regard to the processes from the process of preparing the transfer gates 10 and 12 on the silicon substrate 16 (FIG. 11) to the process for removing the damaged layer through chemical dry etching (CDE) using a conventional down flow etcher (FIG. 13), and repetition of their explanations is omitted. FIGS. 20 through 25 are cross-sectional views arranged in sequential order of steps of a process for manufacturing a cylindrical capacitor according to the embodiment 3. Throughout FIGS. 11 through 13 and FIGS. 20 through 25, like reference numerals designate like elements, and repetition of their explanations is omitted.

Figure 20:
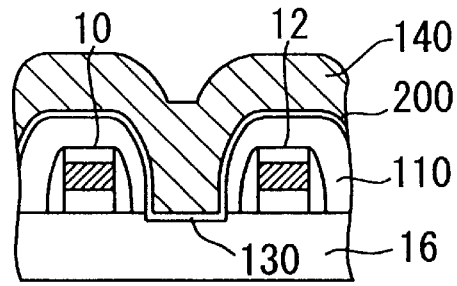
FIGS. 20 through 25 are cross-sectional views arranged in sequential order of steps of a process for manufacturing a cylindrical capacitor according to the embodiment 3.

As shown in FIG. 20, after formation of a storage node direct contact, a SiN film 200 (or a silicon nitride film which will hereinafter be referred to simply as a "nitride film") is formed as an etch stopper film on the TEOS film 110. The etch stopper film (i.e., the nitride film) desirably assumes a thickness of 30 to 150 nm, and a thick polysilicon film 140 is formed to a thickness of 8000 angstroms on the nitride film 200.

Figure 21:
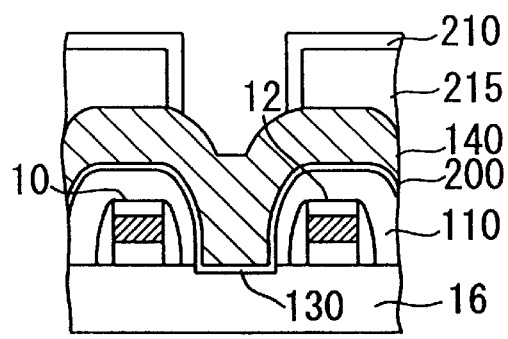

As shown in FIG. 21, an etch pattern for use in forming a storage node is formed on the thick polysilicon film 140 by use of a positive photoresist 215. After photolithography, the photoresist 215 is subjected to the RELACS processing. The photoresist 215 is subjected to RELACS processing through use of organic material which selectively adheres solely to the surface of the photoresist 215 so that a processed portion may be desirably formed to a thickness of about 500 angstroms. The portion of the photoresist 215 that is processed through the RELACS processing, i.e., a (photoresist frame) portion 210, may assume a thickness of about 250 to 2500 angstroms.

Figure 22:
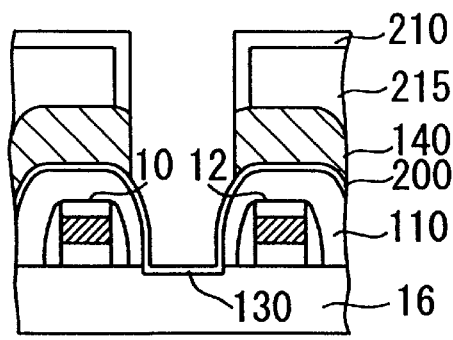

As shown in FIG. 22, the thick polysilicon film 140 is etched along the framed etch pattern through anisotropic etching. So long as the etch time is set such that the thick polysilicon film 140 and the nitride film 200 can be selectively etched, the internal cylindrical portion of the cylindrical capacitor (storage node) is formed. Subsequently, only the nitride film 200 is removed through use of a conventional down flow etcher, thereby establishing electrical connection between the storage node direct contact and the silicon substrate 16.

Figure 23:
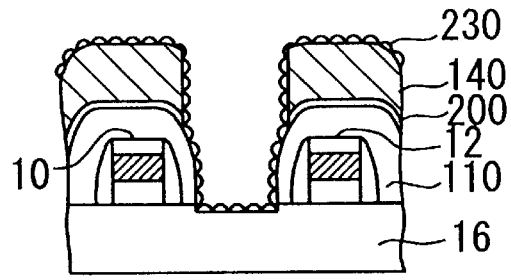
Figure 24:
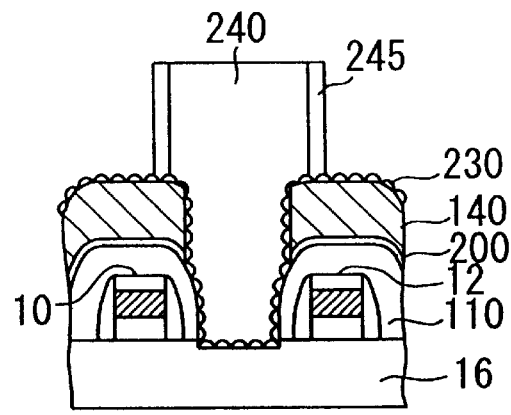

As shown in FIG. 23, the thick polysilicon film 140 is roughened to a roughness of about 2.0. The roughness may assume a value of 1.5 to 2.5 or thereabouts. The thick polysilicon film 140 that has been roughened is designated a roughened film 230 in FIG. 23. The polysilicon film 140 may be roughened through use of a single wafer low pressure CVD system. As shown in FIG. 24, an etch pattern is formed on the roughened film 230 by use of the previously-used storage node mask and a negative photoresist 240 which is opposite in polarity to the previously-used photoresist. Even in this case, after photolithography, the photoresist 240 is subjected to RELACS processing such that a processed portion may be desirably formed in the photoresist 240 to a thickness of about 500 angstroms. The portion 185 that has been subjected to RELACS processing may assume a thickness of about 250 to 1500 angstroms. As a result of RELACS processing, a thickness of about 500 angstroms may be ensured as a registration margin for photolithography.

Figure 25:
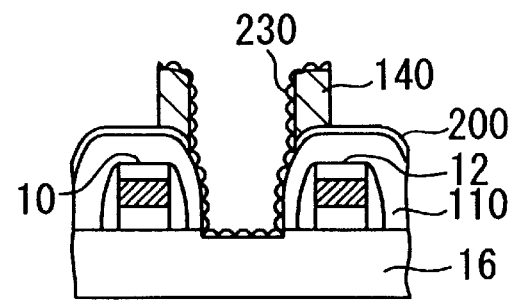

As shown in FIG. 25, through anisotropic etching the thick polysilicon film 140 is dry-etched along the etch pattern. The photoresist 240 is then removed, thereby forming the outer cylindrical portion of the cylindrical capacitor (storage node).

As mentioned above, according to the embodiment 3, the hole requires a minimum diameter of about 0.20 μm. Compared with the conventional hole diameter 412 that assumes a minimum value of 0.1 μm, the hole diameter formed in the embodiment 3 provides an added margin. Therefore, there is no necessity for a process for reducing the hole diameter. According to the embodiment 3, even if the hole diameter has a deviation of about 0.05 μm, contact can be established with the silicon substrate. Accordingly, an expensive high precision stepper, which has been required for ensuring a registration margin, becomes unnecessary.

As in the case of the embodiment 2, according to the embodiment 3, the damaged layer 30 is removed after formation of the storage node direct contact during chemical dry etching (CDE), through use of a conventional down flow etcher. However, the damaged layer 30 may also be removed simultaneously with removal of the nitride film 200 shown in FIG. 22, through use of a conventional down flow etcher (employing an identical $O_2$-rich etching gas and a small amount of $CHF_3$ that is added during the processing).

In the embodiment 3, RELACS processing is employed for the photolithography during which is formed a storage node etch pattern. Aside from this processing, a result similar to that yielded by RELACS processing may be obtained by baking the photoresist 215 or 240 at a high temperature (e.g., 200° C.) after formation of the storage node etch pattern so as to effect bulging (hereinafter referred to as a "thermal bulging process").

Although according to the embodiment 3 a TEOS film is formed as the oxide film 110 through use of a conventional diffusion furnace, the simplified manufacturing flow described in connection with the embodiment 3 can be carried out even when a single wafer BPTEOS film—which has recently tended to be formed as an oxide film and is to be used for smoothing during heat sintering—may be formed as the oxide film 110.

Further, even when the roughening process shown in FIGS. 23 through 25 is not performed, the simplified manufacturing flow that has been described in connection with the embodiment 3 may be carried out.

Embodiment 4

FIGS. 26 through 31 are cross-sectional views arranged in sequential order of steps of a process for manufacturing a cylindrical capacitor according to a embodiment 4. Throughout FIGS. 26 through 31, like reference numerals designate like elements, and repetition of their explanations are omitted here.

As shown in FIG. 26, the transfer gates 10 and 12 are prepared on the silicon substrate 16 according to a method identical with the conventional manufacturing method. An oxide film 260 which serves as an interlayer dielectric layer is formed over the transfer gates 10 and 12. A storage node contact is formed between the area of the oxide film 260 formed on the transfer gate 10 and the area of the oxide film 260 formed on the transfer gate T12. The bottom of the storage node contact is designated by reference numeral 262 in FIG. 26. A non-doped polysilicon film 264 is deposited on both the oxide film 260 and the silicon substrate 16 at the bottom 262 of the storage node contact. Through a mask having a pattern such as that shown in FIG. 26, a pattern—which enables a storage node direct contact hole to be formed to a minimum diameter of about 0.30 μm—is imaged on the non-doped polysilicon film 264 through use of photolithography employing a positive photoresist 266.

Figure 29:
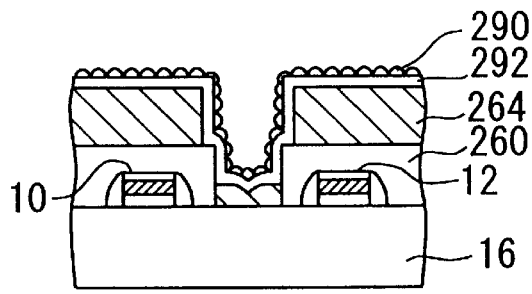

As shown in FIG. 27, the positive photoresist 266 is subjected to RELACS processing, thereby forming a positive photoresist frame 270. As a result, the diameter of the positive photoresist 266 is reduced by about 100 nm. The positive photoresist frame 270 desirably assumes a thickness of about 500 angstroms, and may assume a value of about 250 to 1500 angstroms. As shown in FIG. 28, the non-doped polysilicon film 264 is etched through anisotropic dry etching so as to leave a non-doped polysilicon film 280 at the bottom of the contact hole, thereby forming the internal diameter of the cylindrical storage node. As shown in FIG. 29, a thin polysilicon film 292 is deposited to a thickness of 100 nm on the non-doped polysilicon film 264, the oxide film 260, and the non-doped polysilicon film 280 left at the bottom of the contact hole. The thin polysilicon film 292 is roughened in order to increase the capacitance of the storage node. The roughness assumes a value of about 2.0 and may assume a value of about 1.5 to 2.5. The thus-roughened thin polysilicon (deposition) film 292 is designated as a surface-roughened film 290 in FIG. 29 and is formed by use of a single wafer low pressure CVD system.

Figure 30:
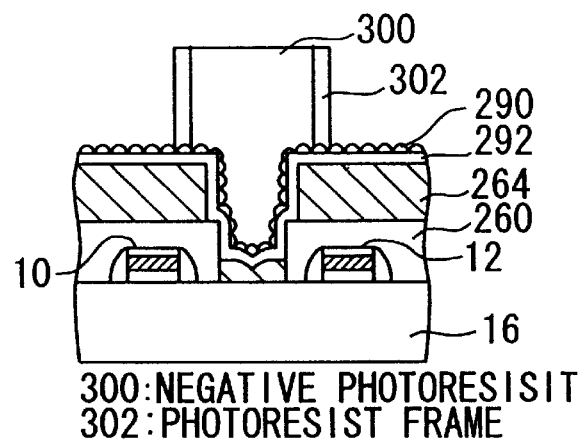
Figure 31:
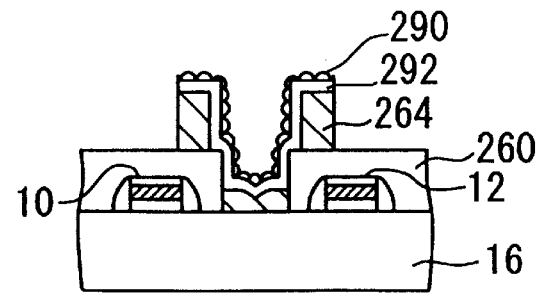

As shown in FIG. 30, the wafer is subjected to photolithography by use of the previously-used mask (FIG. 26) and a negative photoresist 300. The negative photoresist 300 is subjected to RELACS processing, thereby forming a photoresist frame 302 and enlarging the diameter of the negative photoresist 300 by 100 nm. The frame 302 of the negative photoresist 300 desirably assumes a thickness of about 500 angstroms and may assume a thickness of about 250 to 1500 angstroms. As shown in FIG. 31, after formation of the negative photoresist 300; the non-doped polysilicon film 264, the thin polysilicon film 292, and the roughened film 290 are removed through dry etching until the oxide film 260 becomes uncovered. The negative photoresist 300 is then removed to thereby form the outer cylindrical portion of the cylindrical capacitor (or storage node).

As mentioned above, according to the embodiment 4, a storage node can be formed through a manufacturing flow made simpler than the conventional manufacturing flow, through use of a storage node formation process which requires fewer masks than does the conventional process for forming the storage node of cylindrical capacitor structure. Further, even in a case where the roughening processes shown in FIGS. 29 through 31 are not carried out, the simplified manufacturing flow described in connection with the embodiment 4 can be carried out.

Embodiment 5

FIGS. 32 through 37 are cross-sectional views arranged in sequential order of a process for manufacturing a cylindrical capacitor according to a embodiment 5 of the present invention. Throughout FIGS. 32 through 37, like reference numerals designate like elements, and repetition of their explanations are omitted.

Figure 32:
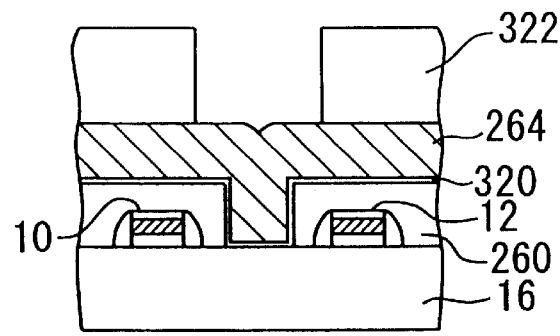
FIGS. 32 through 37 are cross-sectional views arranged in sequential order of a process for manufacturing a cylindrical capacitor according to a embodiment 5 of the present invention.

As shown in FIG. 32, the transfer gates 10 and 12 are formed on the silicon substrate 16 according to a method identical with the conventional manufacturing method. An oxide film 260 which serves as an interlayer dielectric film is formed over the transfer gates 10 and 12. A storage node contact is formed between the area of the oxide film 260 formed on the transfer gate 10 and the area of the oxide film 260 formed on the transfer gate 12. The bottom of the storage node contact is designated by reference numeral 262 in FIG. 32. A nitride film 320 which acts as a polysilicon etch stopper is deposited to a thickness of 50 nm on both the oxide film 260 and the silicon substrate 16 at the bottom 262 of the storage node contact. The etch stopper (silicon nitride) film 320 desirably assumes a thickness of 30 to 150 nm, and the non-doped polysilicon film 264 is deposited on the nitride film 320. Through a mask, a pattern—which enables a storage node to be formed to a minimum diameter of about 0.30 μm—is imaged on the non-doped polysilicon film 264 by use of photolithography using a positive photoresist 322.

Figure 33:
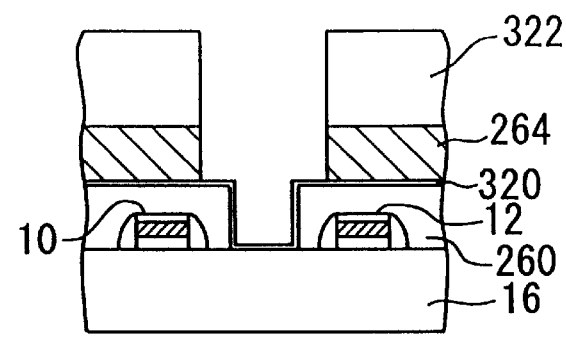
Figure 34:
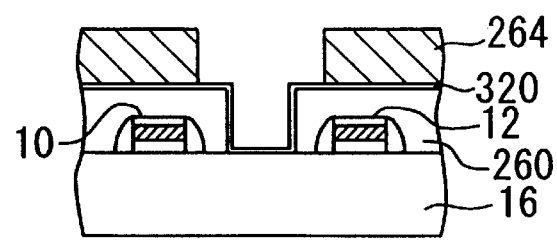
Figure 35:
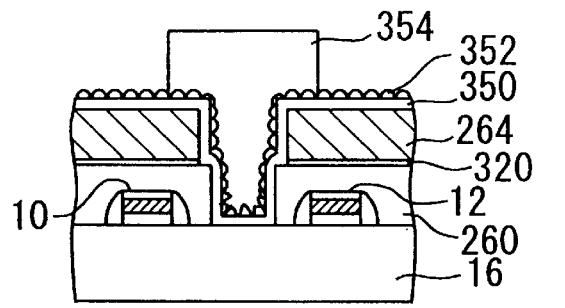

As shown in FIG. 33, the positive photoresist 322 is subjected to RELACS processing, thereby forming a positive photoresist frame 330. As a result, the diameter of the positive photoresist 322 is reduced by about 100 nm. The positive photoresist frame 322 desirably assumes a thickness of about 500 angstroms and may assume a value of about 250 to 1500 angstroms. As shown in FIG. 34, the non-doped polysilicon film 264 is selectively etched through anisotropic dry etching so as to leave a non-doped polysilicon film 280 until the etch stopper nitride film 320 becomes uncovered, thereby forming the internal diameter of the cylindrical storage node. After the anisotropic etching, the etch stopper nitride film 320 is anisotropically etched away. As shown in FIG. 35, a thin polysilicon film 350 is deposited to a thickness of 100 nm on the non-doped polysilicon film 264. The thin polysilicon film 350 is roughened in order to increase the capacitance of the storage node. The roughness assumes a value of about 2.0 and may assume a value of about 1.5 to 2.5. The thus-roughened thin polysilicon film 350 is designated a surface-roughened film 352 in FIG. 35 and is formed through use of a single wafer low pressure CVD system.

Figure 36:
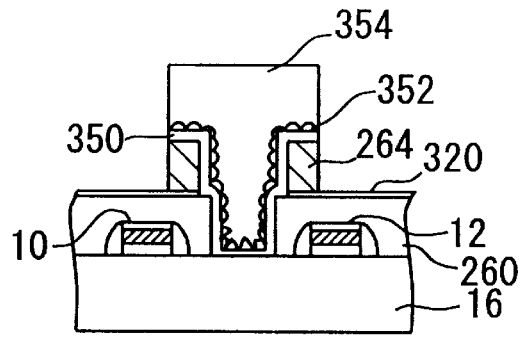
Figure 37:
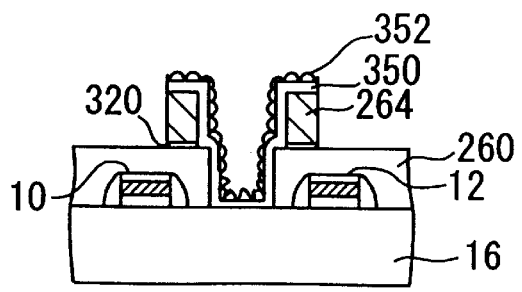
Figure 38:
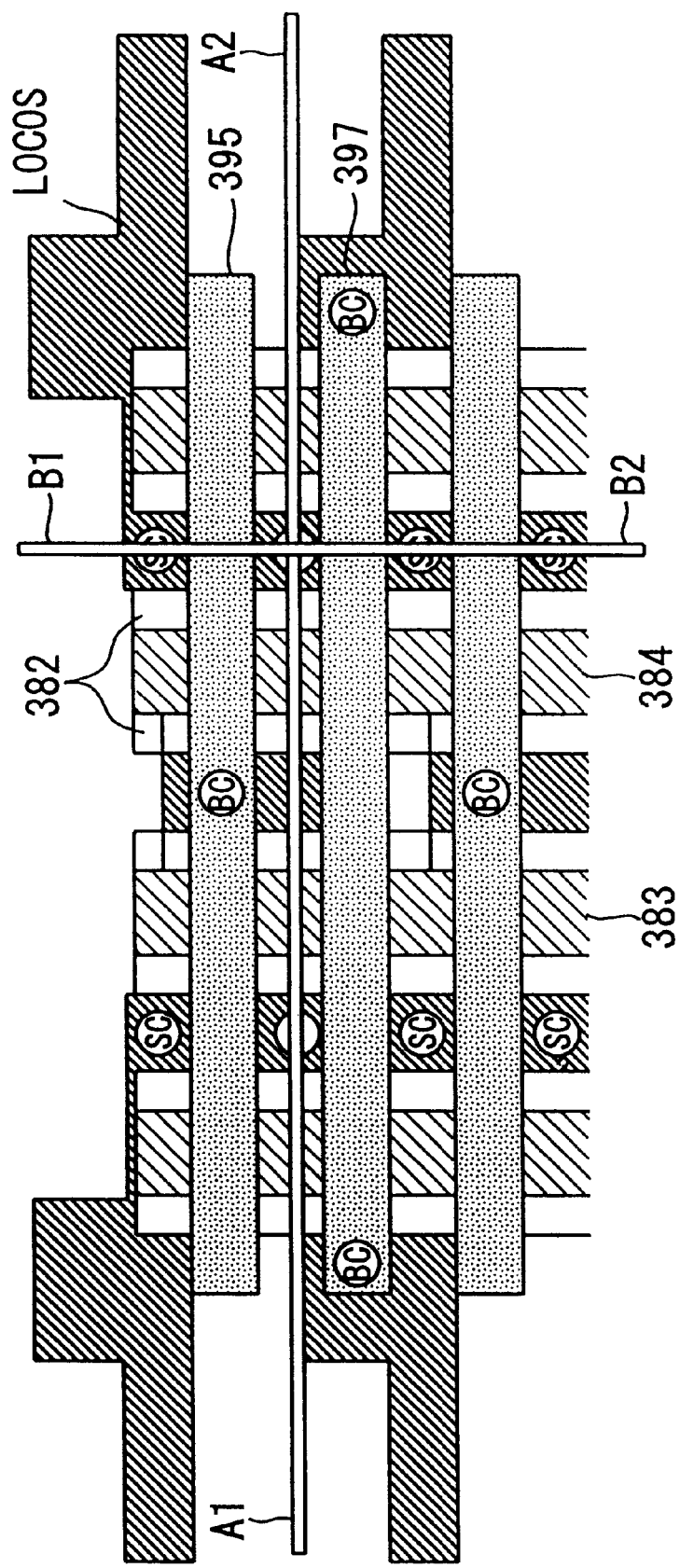
FIG. 38 is a top view showing the structure of a storage node of a conventional cylindrical capacitor.
Figure 39A:
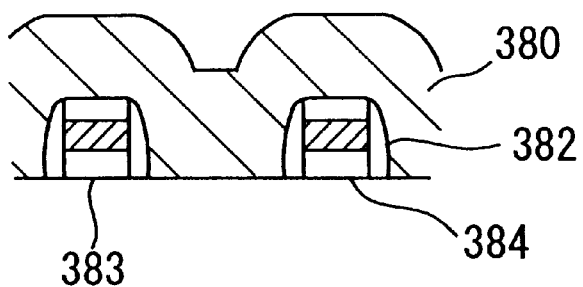
Figure 39B:
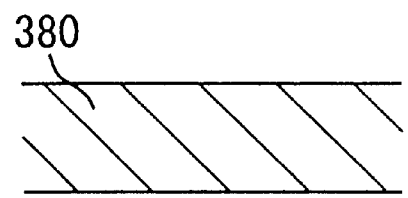
Figure 40A:
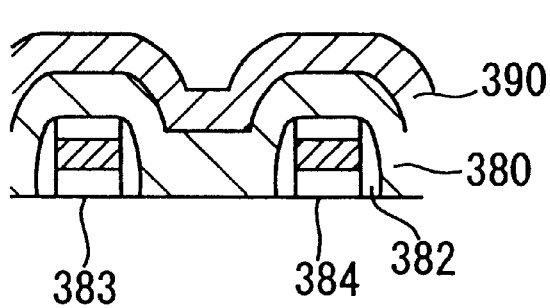
FIGS. 40A and 40B shows an oxide film 390 which is formed (at a position between the polysilicon bit line and the storage node) over the oxide film 380.
Figure 40B:
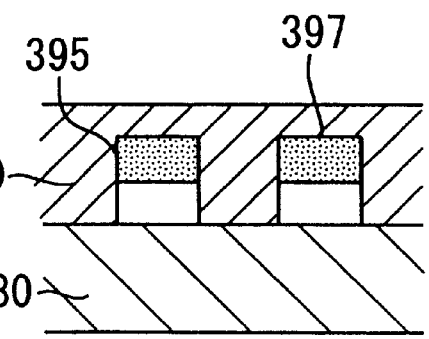
Figure 41A:
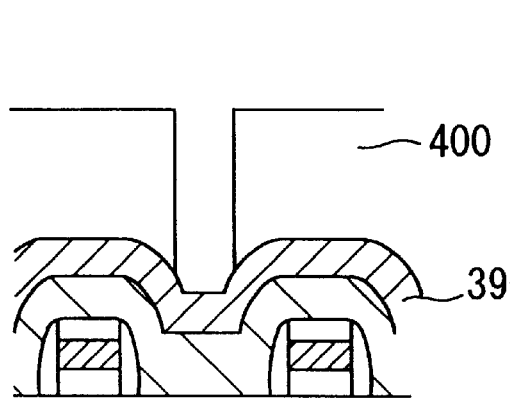
FIGS. 41A and 41B show an etch pattern which enables a storage node to be formed so as to make direct contact with the substrate is formed on the oxide film 390 by use of a photoresist 400.
Figure 41B:
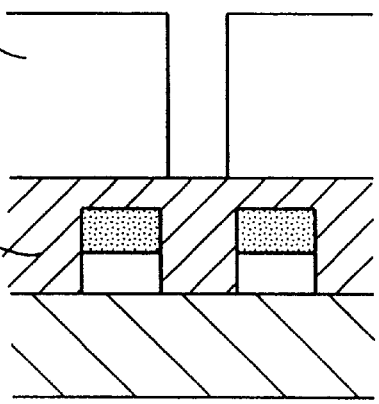
Figure 42A:
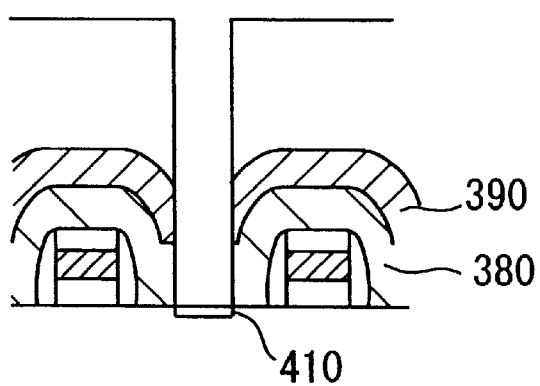
FIGS. 42A and 42B show that the oxide films 380 and 390 are subjected to dry etching along the etch pattern.
Figure 42B:
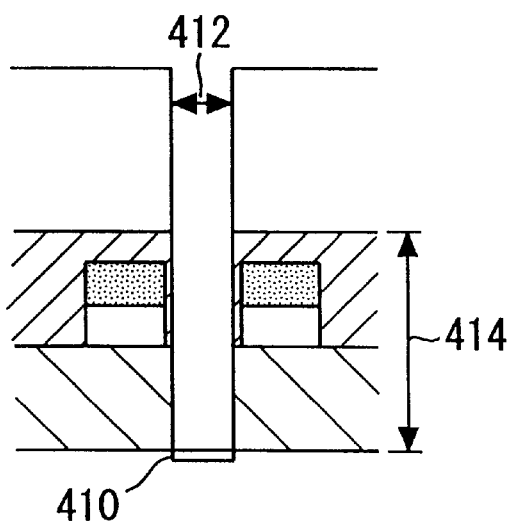
Figures 45A, 45B:
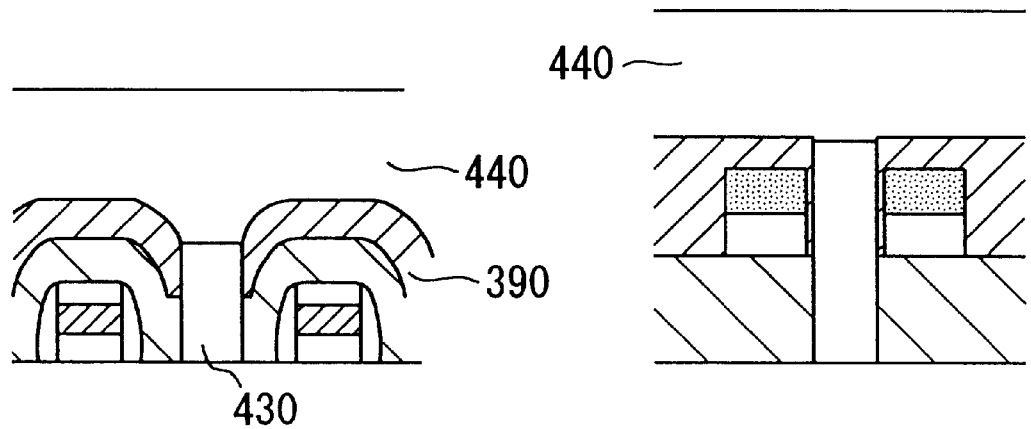
FIGS. 45A and 45B show that a polysilicon film 440 is formed over the polysilicon plug 430 and the oxide film 390.
Figures 46A, 46B:
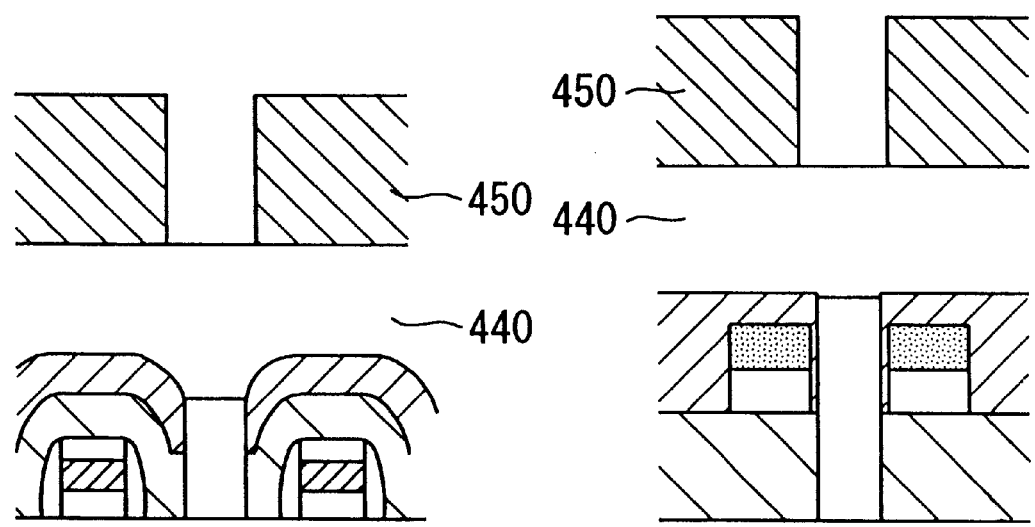
FIGS. 46A and 46B show that an etch pattern is formed on the polysilicon film (for use in forming a storage node) 440 through use of a photoresist film 450.
Figure 47A:
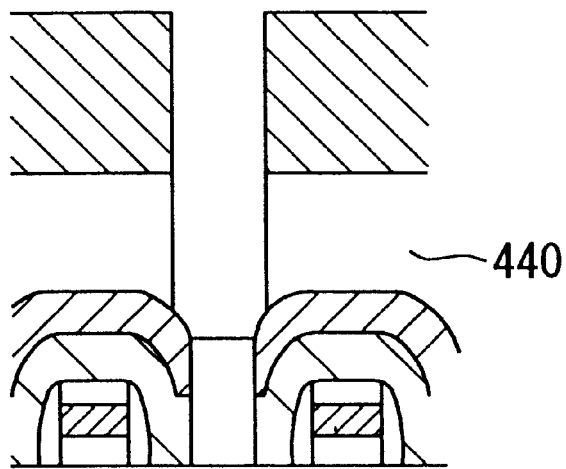
FIGS. 47A and 47B show that the polysilicon film 440 is etched to the oxide film 390.
Figure 47B:
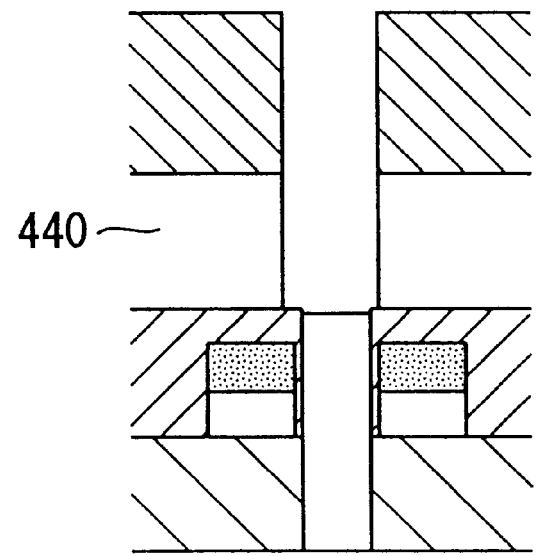
Figure 48A:
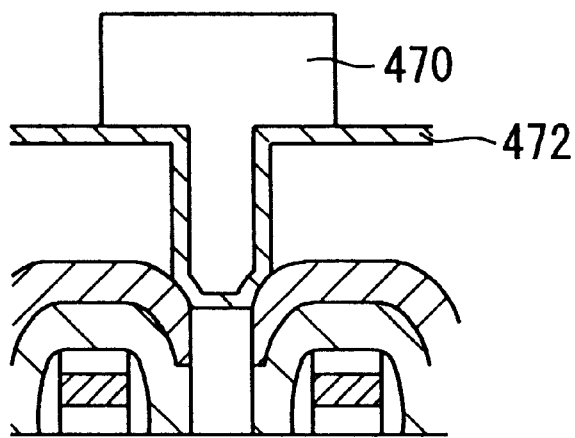
FIGS. 48A and 48B show that a frame 472 which will serve as the internal surface of a cylindrical storage node is formed on the surface of the oxide film 440 through a framing process.
Figure 48B:
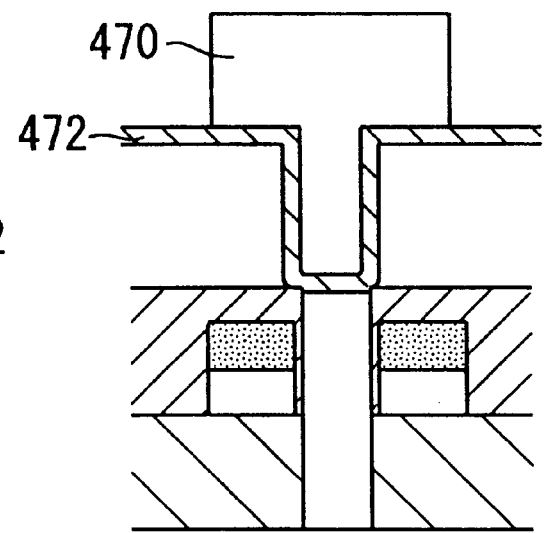
Figure 49A:
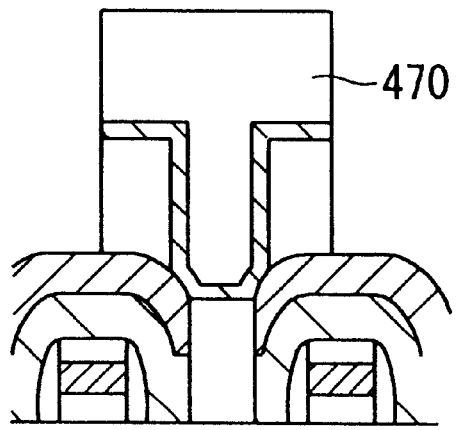
FIGS. 49A and 49B show the wafer after etching.
Figure 49B:
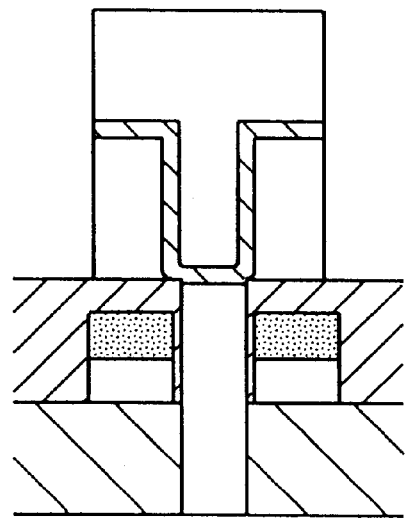
Figure 50A:
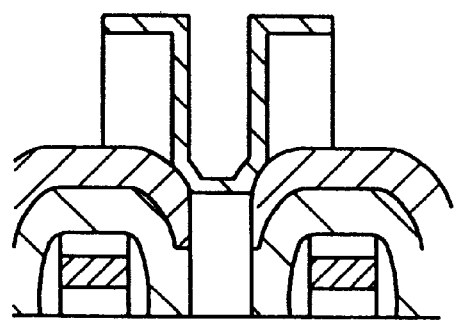
Figure 50B:
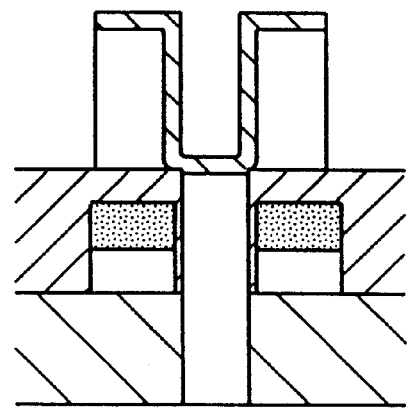

As shown in FIG. 36, through the previously-used mask (FIG. 32), the wafer is subjected to photolithography employing a negative photoresist 354. The negative photoresist 354 is subjected to RELACS processing, thereby forming a photoresist frame 362 and enlarging the diameter of the negative photoresist 354 by 100 nm. The frame 362 of the negative photoresist 354 desirably assumes a thickness of about 500 angstroms and may assume a thickness of about 250 to 1500 angstroms. As shown in FIG. 37, after formation of the negative photoresist 354; the non-doped polysilicon film 264, the thin polysilicon film 350, and the roughened film 352 are removed through dry etching until the oxide film 260 becomes uncovered. The negative photoresist 354 is then removed to thereby form the outer cylindrical portion of the cylindrical capacitor (or storage node).

As mentioned above, according to the embodiment 5, a storage node can be formed through a manufacturing flow made simpler than the conventional manufacturing flow, through use of a storage node formation process which requires fewer masks than does the conventional process for forming the storage node of cylindrical capacitor structure. Further, even in a case where the roughening processes shown in FIGS. 35 through 37 are not carried out, the simplified manufacturing flow described in connection with the embodiment 4 can be carried out.

As has been described above, the semiconductor device manufacturing method employs a simplified manufacturing flow which eliminates a high resolution process for ensuring a registration margin. Therefore, there can be provided a semiconductor device manufacturing method which involves fewer manufacturing steps without use of an expensive high precision stepper or half tone mask.

In the semiconductor device manufacturing method, the second dry etching step may be followed by a step of roughening the surface of the thick polysilicon film; the third etch pattern forming step may involve formation of an etch pattern on the thus-roughened thick polysilicon film, through the storage node mask and by use of a negative photoresist; and the third dry etch step may involve formation of a storage node by dry-etching the thus-roughened thick polysilicon film along an etch pattern formed in the third etch pattern forming step, by means of anisotropic etching.

There is provided a method of forming a semiconductor device comprising: a step of forming on a silicon substrate a plurality of transfer gates, each of which has a frame; a step of forming an oxide film for use as an interlayer dielectric film so as to extend over the plurality of transfer gates and holes formed between the plurality of transfer gates; a first etch pattern forming step of forming on the oxide film an etch pattern which can establish contact with the silicon substrate so as to extend across the frames through a storage node mask using a positive photoresist; a first dry etch step of dry-etching the oxide film along the etch pattern by setting an etch time to a time required for etching away the oxide film deposited at the bottom of the hole; a damaged layer removal step of removing a damaged layer formed on the silicon substrate as a result of the first dry etching step, by means of dry chemical etching; a step of forming an etch stopper film on the oxide film; a step of forming a thick polysilicon film on the oxide film; a step of forming a thick polysilicon film on the etch stopper film; a second etch pattern forming step of forming the etch pattern on the thick polysilicon film, through the previously-used storage node mask once again and by use of a positive photoresist; a step of forming a frame along the surface of the positive photoresist formed during the second etch pattern forming step; a second dry etch step of dry-etching the thick polysilicon film along the etch pattern having the frame formed therein, by setting an etch time to a time required for etching away the thick polysilicon film to the etch stopper film; a third etch pattern forming step of forming an etch pattern on the thick polysilicon film, through the storage node mask and by use of a negative photoresist; a step of forming a frame along the surface of the negative photoresist formed during the third etch pattern forming step; and a third dry etch step of forming a storage node by dry-etching the thick polysilicon film along the etch pattern, in which a frame is formed during the framing step, by means of anisotropic etching.

In the semiconductor device manufacturing method, the second dry etching step may be followed by a step of roughening the surface of the thick polysilicon film; the third etch pattern forming step may involve formation of an etch pattern on the thus-roughened thick polysilicon film, through the storage node mask and by use of a negative photoresist; and the third dry etch step may involve formation of a storage node by dry-etching the thus-roughened thick polysilicon film along an etch pattern, in which a frame is formed during the frame forming step, by means of anisotropic etching.

There is provided a method of forming a semiconductor device comprising: a step of forming on a silicon substrate a plurality of transfer gates, each of which has a frame; a step of forming an oxide film for use as an interlayer dielectric film so as to extend over the plurality of transfer gates; a step of forming an etch stopper film on the oxide film and holes formed among the plurality of transfer gates; a step of forming a non-doped polysilicon film on the etch stopper film; a first etch pattern forming step of forming on the non-doped film an etch pattern which can establish contact with the silicon substrate so as to extend across the frames, through a storage node mask and by use of a positive photoresist; a step of forming a frame along the surface of the positive photoresist formed in the first etch pattern forming step; a first dry etch step of dry-etching the non-doped polysilicon film along the etch pattern, in which a frame is formed, by setting an etch time such that the non-doped polysilicon film can be selectively etched to the etch stopper film; a step of forming a thin polysilicon film on the non-doped polysilicon film and the etch stopper film; a second etch pattern forming step of forming on the thin polysilicon film the etch pattern through the storage node mask using a negative photoresist; a step of forming a frame along the surface of the negative photoresist formed during the second etch pattern forming step; and a second dry etch step of forming a storage node by dry-etching the thin polysilicon film along the etch pattern, in which a frame is formed during the frame forming step, by means of anisotropic etching.

In the semiconductor device manufacturing method, the first dry etching step may be followed by a step of roughening the surface of the thin polysilicon film; the second etch pattern forming step may involve formation of an etch pattern on the thus-roughened thin polysilicon film, through the storage node mask and by use of a negative photoresist; and the second dry etch step may involve formation of a storage node by dry-etching the thus-roughened thin polysilicon film along an etch pattern, in which a frame is formed during the frame forming step, by means of anisotropic etching.

In the semiconductor device manufacturing method, the etch stopper film may assume a thickness of 30 to 150 nm.

In the semiconductor device manufacturing method, the photoresist frame may assume a thickness of 250 to 1500 angstroms.

In the semiconductor device manufacturing method, the storage node may assumes a thickness of 50 to 300 nm.

The present invention has been described in detail with respect to various embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

The entire disclosure of Japanese Patent Application No. 10-340108 filed on Nov. 30, 1998 including specification, claims, drawings and summary are incorporated herein by reference in its entirety.

What is claimed is:

1. A method of manufacturing a semiconductor device comprising the steps of:

forming on a silicon substrate a plurality of transfer gates, each of which has a frame;

forming an oxide film for use as an interlayer dielectric film so as to extend over the plurality of transfer gates and holes formed between the plurality of transfer gates;

a first etch pattern forming on the oxide film an etch pattern which can establish contact with the silicon substrate so as to extend across the frames, through a storage node mask and by use of a positive photoresist;

a first dry-etching the oxide film along the etch pattern by setting an etch time to a time required for etching away the oxide film deposited at the bottom of the hole;

forming a thick polysilicon film on the oxide film;

a second etch pattern forming the etch pattern on the thick polysilicon film, through the previously-used storage node mask once again and by use of a positive photoresist;

a second dry-etching in a collective manner the thick polysilicon film and a damaged layer that is formed on the silicon substrate as a result of the first dry etch step, by setting an etch time to a time required for etching away the thick polysilicon film and the damaged layer;

a third etch pattern forming an etch pattern on the thick polysilicon film, through the storage node mask and by use of a negative photoresist; and a third dry etch forming a storage node by dry-etching the thick polysilicon film along the etch pattern that is formed as a result of the third etch pattern forming step, by means of anisotropic etching.

2. The semiconductor device manufacturing method according to claim 1, wherein said step of second dry-etching is followed by a step of roughening the surface of the thick polysilicon film;

said step of third etch pattern forming involves formation of an etch pattern on the thus-roughened thick polysilicon film, through the storage node mask and by use of a negative photoresist; and said step of third dry etch forming involves formation of a storage node by dry-etching the thus-roughened thick polysilicon film along an etch pattern formed in the third etch pattern forming step, by means of anisotropic etching.

3. The semiconductor device manufacturing method according to claim 1, wherein the storage node is a thickness of 50 to 300 nm.

4. A method of forming a semiconductor device comprising the steps of:

forming on a silicon substrate a plurality of transfer gates, each of which has a frame;

forming an oxide film for use as an interlayer dielectric film so as to extend over the plurality of transfer gates and holes formed between the plurality of transfer gates;

a first etch pattern forming on the oxide film an etch pattern which can establish contact with the silicon substrate so as to extend across the frames, through a storage node mask and by use of a positive photoresist;

a first dry-etching the oxide film along the etch pattern by setting an etch time to a time required for etching away the oxide film deposited at the bottom of the hole;

a damaged layer removing a damaged layer formed on the silicon substrate as a result of the first dry etching step, by means of dry chemical etching;

forming a thick polysilicon film on the oxide film;

a second etch pattern forming on the thick polysilicon film, through the previously-used storage node mask and by use of a positive photoresist;

forming a frame along the surface of the positive photoresist formed during the second etch pattern forming step;

a second dry-etching in a collective manner the thick polysilicon film and a damaged layer that is formed on the silicon substrate as a result of the first dry etch step, by setting an etch time to a time required for etching away the thick polysilicon film such that a portion of the thick polysilicon film is left at the bottom of the hole;

a third etch pattern forming an etch pattern on the thick polysilicon film, through the storage node mask and by use of a negative photoresist;

forming a frame along the surface of the negative photoresist formed during the third etch pattern forming step; and a third dry etch forming a storage node by dry-etching the thick polysilicon film along the etch pattern, in which a frame is formed during the frame forming step, by means of anisotropic etching.

5. The semiconductor device manufacturing method according to claim 4, wherein said step of second dry etching is followed by a step of roughening the surface of the thick polysilicon film;

said step of third etch pattern forming involves formation of an etch pattern on the thus-roughened thick polysilicon film, through the storage node mask and by use of a negative photoresist; and said step of third dry etch forming involves formation of a storage node by dry-etching the thus-roughened thick polysilicon film along an etch pattern, in which a frame is formed during the frame forming step, by means of anisotropic etching.

6. The semiconductor device manufacturing method according to claim 5, wherein the etch stopper film is a thickness of 30 to 150 nm.

7. The semiconductor device manufacturing method according to claim 4, wherein the photoresist frame is a thickness of 250 to 1500 angstroms.

8. The semiconductor device manufacturing method according to claim 4, wherein the storage node is a thickness of 50 to 300 nm.

9. A method of forming a semiconductor device comprising the steps of:

forming on a silicon substrate a plurality of transfer gates, each of which has a frame;

forming an oxide film for use as an interlayer dielectric film so as to extend over the plurality of transfer gates;

forming a non-doped polysilicon film on the oxide film;

a first etch pattern forming on the oxide film an etch pattern which can establish contact with the silicon substrate so as to extend across the frames, through a storage node mask and by use of a positive photoresist;

forming a frame along the surface of the positive photoresist formed in the first etch pattern forming step;

a first dry-etching the non-doped polysilicon film along the etch pattern, in which a frame is formed, by setting an etch time to a time required for etching away the non-doped polysilicon film such that a portion of the non-doped polysilicon film is left at the bottom of each of the holes formed among the plurality of transfer gates;

forming a thin polysilicon film on the non-doped polysilicon film, the oxide film, and the non-doped polysilicon film remaining at the bottom of the hole;

a second etch pattern forming the etch pattern on the thin polysilicon film, through the storage node mask and by use of a negative photoresist;

forming a frame along the surface of the negative photoresist formed during the second etch pattern forming step; and a second dry etch forming a storage node by dry-etching the thin polysilicon film along the etch pattern, in which a frame is formed during the frame forming step, by means of anisotropic etching.

10. The semiconductor device manufacturing method according to claim 9, wherein said step of first dry etching is followed by a step of roughening the surface of the thin polysilicon film;

said step of second etch pattern forming involves formation of an etch pattern on the thus-roughened thin polysilicon film, through the storage node mask and by use of a negative photoresist; and said step of second dry etch involves formation of a storage node by dry-etching the thus-roughened thin polysilicon film along an etch pattern, in which a frame is formed during the frame forming step, by means of anisotropic etching.

11. The semiconductor device manufacturing method according to claim 10, wherein the etch stopper film is a thickness of 30 to 150 nm.

12. The semiconductor device manufacturing method according to claim 9, wherein the photoresist frame is a thickness of 250 to 1500 angstroms.

13. The semiconductor device manufacturing method according to claim 9, wherein the storage node is a thickness of 50 to 300 nm.

* * * * *